United States Patent
Fan et al.

(10) Patent No.: US 8,971,453 B1
(45) Date of Patent: Mar. 3, 2015

(54) DIGITAL RECEIVER SYSTEM ACTIVATED BY RSSI SIGNAL

(71) Applicant: Uniband Electronic Corp., Hsin-Chu, TX (US)

(72) Inventors: Yiping Fan, Hsinchu (TW); Chun-Yuan Lin, Pingtung County (TW); Sheng-Chia Huang, Hsinchu (TW); Chun-Chin Chen, Taoyuan County (TW)

(73) Assignee: Uniband Electronic Corp., Hsin-Chu (TW)

( * ) Notice: Subject to any disclaimer, the term of this patent is extended or adjusted under 35 U.S.C. 154(b) by 0 days.

(21) Appl. No.: 14/013,043

(22) Filed: Aug. 29, 2013

(51) Int. Cl.
*H04L 27/00* (2006.01)
*H03G 3/30* (2006.01)
*H03G 3/00* (2006.01)

(52) U.S. Cl.
CPC .............. *H03G 3/3036* (2013.01); *H03G 3/001* (2013.01)
USPC ........... 375/316; 375/285; 375/319; 375/320; 375/324; 375/332

(58) Field of Classification Search
CPC .............. H03F 1/0277; H03F 2200/18; H03F 2200/27; H03F 2200/294; H03F 2200/411; H03F 2200/451; H03F 2203/7206; H03F 2203/7236; H03F 3/193; H03F 3/72; H03G 1/0088; H03G 3/3052; H03G 3/3068; H03G 3/3078; H03G 3/3036; H03G 7/00; A61B 2560/0209; H04B 7/18547; H04B 17/0057; H04B 1/1081; H04B 1/7115; H04B 1/7117; H04B 1/712; H04B 7/0805; H04B 7/0811; H04B 7/0845; H04B 1/109; H04B 17/0042; H04B 1/1027; H04B 10/1121; H04B 10/66; H04B 1/18; H04B 5/02; H04B 7/087; H04N 21/4524; H04N 21/4622; H04N 21/47214; H04N 21/4782

See application file for complete search history.

(56) References Cited

U.S. PATENT DOCUMENTS

| | | | |
|---|---|---|---|
| 7,203,471 B2 * | 4/2007 | Cutcher et al. | 455/212 |
| 7,450,911 B1 * | 11/2008 | Venkatesh | 455/73 |
| 7,907,555 B1 * | 3/2011 | Sankabathula et al. | 370/284 |
| 7,999,738 B2 * | 8/2011 | Melconian et al. | 342/427 |
| 8,355,687 B2 * | 1/2013 | Wood | 455/232.1 |
| 8,571,152 B1 * | 10/2013 | Chen et al. | 375/345 |
| 8,588,719 B1 * | 11/2013 | Mehrotra | 455/234.2 |
| 2008/0090606 A1 * | 4/2008 | Hwang et al. | 455/553.1 |

(Continued)

FOREIGN PATENT DOCUMENTS

WO    WO 2007001266 A1 *    1/2007    ............... H04N 5/44

*Primary Examiner* — Hirdepal Singh
(74) *Attorney, Agent, or Firm* — Winston Hsu; Scott Margo

(57) ABSTRACT

A digital receiver includes a radio frequency analog front end, a digital processing unit, a plurality of cascaded amplifier stages configured to receive output of the radio frequency analog front end, a first analog to digital converter configured to convert an analog signal output from the plurality of cascaded amplifier stages into a digital signal output to the digital processing unit, a first received signal strength indicator unit configured to receive outputs of each of the plurality of cascaded amplifier stages and output signal to the digital processing unit, a second received signal strength indicator unit configured to receive output of at least one amplifier stage in the plurality of cascaded amplifier stages, and a received signal strength indicator detection unit configured to activate and to deactivate digital units according to a comparison of output from the second received signal strength indicator unit to a predetermined threshold.

20 Claims, 3 Drawing Sheets

(56) References Cited

U.S. PATENT DOCUMENTS

| | | | |
|---|---|---|---|
| 2008/0293370 A1* | 11/2008 | Wood | 455/250.1 |
| 2009/0197554 A1* | 8/2009 | Shi et al. | 455/226.2 |
| 2011/0287725 A1* | 11/2011 | Hong et al. | 455/90.2 |
| 2012/0057621 A1* | 3/2012 | Hong et al. | 375/219 |
| 2013/0083648 A1* | 4/2013 | de Ruijter et al. | 370/216 |
| 2013/0176869 A1* | 7/2013 | Finlow-Bates et al. | 370/252 |
| 2014/0073278 A1* | 3/2014 | Fan et al. | 455/253.2 |
| 2014/0080417 A1* | 3/2014 | Kyles et al. | 455/41.2 |

\* cited by examiner

DIGITAL RECEIVER SYSTEM ACTIVATED BY RSSI SIGNAL

BACKGROUND OF THE INVENTION

1. Field of the Invention

This application relates to a digital receiver, and more specifically, to turning off digital circuits within the digital receiver according to a received signal strength indicator (RSSI).

2. Description of the Prior Art

In typical receiver system for a digital communication system, there area radio frequency (RF) and analog unit, and a digital signal processing unit. Analog to digital converters (ADC) are used to convey transmitted information from analog domain to digital domain for digital processing and to connect these units in hardware. Within the RF and analog unit, a circuit called RSSI is often included to determine the received signal or interference level within a certain predetermined signal bandwidth. In addition to determining the signal or interference level, RSSI is also used for clear channel assessment and automatic gain control.

In a digital communication system, the transmitted signal must use certain data patterns, for example a predefined preamble, so that the receiver can sync and decode the transmitted signal. However, in the real world, due to noise, interference, and distortion, the transmitted data package can get lost. There are two scenarios resulting in a lost package. The first scenario is missed detection, which means that when the transmitted data package is presented at the receiver, the receiver cannot correctly receive and decode it. The second scenario can occur after a false alarm, which means that when there is no data package presented at the receiver, the digital processing unit mistakenly starts to process a nonexistent package. For example, the digital processing unit may receive an erroneous signal due to noise or the like and begin processing the erroneous signal. Since it takes a certain amount of time for the digital processing unit to determine that the erroneous signal is not a valid packet but a false alarm, if a real data package arrives when the receiver has not yet recovered from the false alarm, missed detection of the real data package may occur.

Please refer to FIG. 1, which illustrates a false alarm scenario 100. In FIG. 1, packets 110 and 130 are being received sequentially from left to right. The first two packets 110 are received and processed normally. At time point 120, a false alarm occurs. Shortly after the false alarm 120 occurs, packet 130 arrives at the receiver. However, detection of the packet 130 is missed because it arrived during a time window shown as $T_{drop}$ where the digital processing unit is recovering from the false alarm 120 and is unable to correctly process the packet 130. Therefore, it is very necessary to reduce or remove the above mentioned situation.

SUMMARY OF THE INVENTION

A digital receiver is proposed that comprises a radio frequency analog front end, a digital processing unit, a plurality of cascaded amplifier stages configured to receive output of the radio frequency analog front end, a first analog to digital converter configured to convert an analog signal output from the plurality of cascaded amplifier stages into a digital signal output to the digital processing unit, a first received signal strength indicator unit configured to receive outputs of each of the plurality of cascaded amplifier stages and output signal to the digital processing unit, a second received signal strength indicator unit configured to receive output of at least one amplifier stage in the plurality of cascaded amplifier stages, and a received signal strength indicator detection unit configured to activate and to deactivate the digital processing unit according to a comparison of output from the second received signal strength indicator unit to a predetermined threshold. The digital receiver may be further configured to deactivate the first received signal strength indicator unit when the digital processing unit is deactivated by the received signal strength indicator detection unit.

Another digital receiver is proposed that comprises a radio frequency analog front end, a digital processing unit, a plurality of cascaded amplifier stages configured to receive output of the radio frequency analog front end, a 1-bit analog to digital converter configured to convert an analog signal output from the plurality of cascaded amplifier stages into a digital signal output to the digital processing unit, a first received signal strength indicator unit configured to receive outputs of each of the plurality of cascaded amplifier stages and output signal to the digital processing unit, a second received signal strength indicator unit configured to receive output of at least one amplifier stage in the plurality of cascaded amplifier stages, and a received signal strength indicator detection unit configured to activate and deactivate the digital processing unit according to a comparison of output from the second received signal strength indicator unit to a predetermined threshold. The digital receiver may be further configured to deactivate the first received signal strength indicator unit when the digital processing unit is deactivated by the received signal strength indicator detection unit.

A method of operating a digital receiver comprising a radio frequency analog front end, a digital processing unit, a plurality of cascaded amplifiers configured to receive output of the radio frequency analog front end, a first analog to digital converter configured to convert an analog signal output from the plurality of cascaded amplifiers into a digital signal output to the digital processing unit, and a first received signal strength indicator unit configured to receive outputs of each of the plurality of cascaded amplifiers and output signal to the digital processing unit is proposed. The method comprises receiving output of at least one amplifier in the plurality of cascaded amplifiers to generate an received signal strength indicator signal, comparing the received signal strength indicator signal to a predetermined threshold to generate a comparison result, and activating the digital processing unit according to a the comparison result. The digital receiver may be further configured to deactivate the first received signal strength indicator unit when the digital processing unit is deactivated by the received signal strength indicator detection unit.

These and other objectives of the present invention will no doubt become obvious to those of ordinary skill in the art after reading the following detailed description of the preferred embodiment that is illustrated in the various figures and drawings.

DETAILED DESCRIPTION

In a receiver system having an RF/analog front end, the RF signal may be down converted to intermediate frequency (IF)

and then amplified. The IF amplifier comprises cascaded multi-stage amplifiers, and the regular RSSI unit can plot a curve corresponding to the strength of the signal according to the output signal of each IF amplifier. In order to have a high dynamic range of RSSI, a large number of stages are required, resulting in high power consumption.

Figure 2:
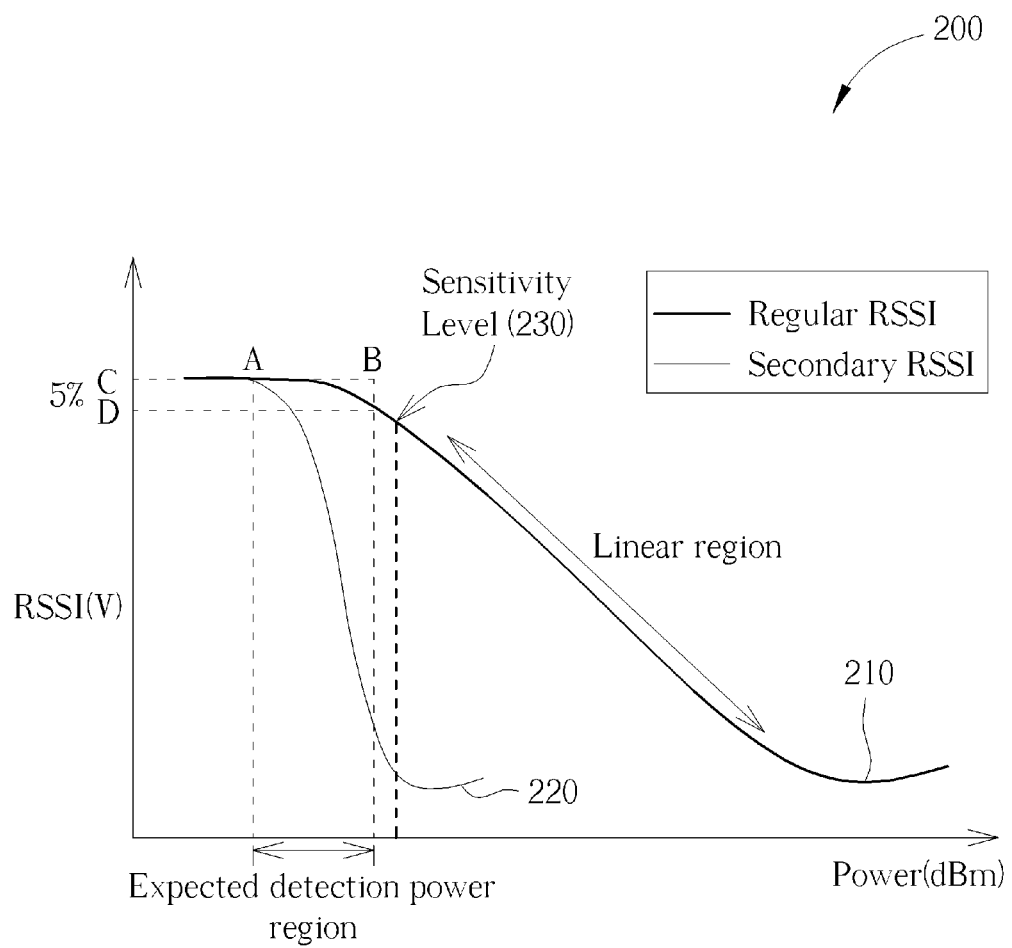
FIG. 2 illustrates an expanded RSSI curve according to one embodiment.

Please refer to FIG. 2 that illustrates an expanded RSSI curve according to one embodiment. FIG. 2 shows the RSSI in volts as the vertical axis, and power in a power ratio in decibels of the measured power referenced to one milli-watt (dBm) as the horizontal axis. The expected power region for RSSI detection extends from "A" to "B" but may be extended to the vertical line shown as Receiver Sensitivity Level 230. Unfortunately, the regular RSSI curve 210 is shaped somewhat like a slash ("\") during the linear region, and flat at the edges of the dynamic range. This means it is difficult to define a threshold direct current (DC) level for a comparator at a signal power level lower than the sensitivity level 230 because there is little change in voltage (from "C" to "D") of the RSSI within this region and a wide range of power would correspond quite closely to the DC level. Choosing a DC level that falls within the linear region of the RSSI curve may solve this problem, but the linear region of the RSSI curve falls in the signal power level higher than the sensitivity level and it is not acceptable to sacrifice the sensitivity of a receiver. Additional amplifier stages can extend the linear region to a wanted power level, but it also means more power consumption when the receiver is not receiving packets.

To extend the useful dynamic range of the RSSI curve without the need for a larger number of RSSI stages, the use of a second RSSI curve 220 is proposed to activate and deactivate the digital unit to reduce false alarms while also reducing power consumption. Since only the second RSSI with lower stages needs to be turned on for detection, the regular RSSI can be turned off during detection and turned on only when the digital unit is needed to sample the RSSI value.

Preferred characteristics of the second RSSI curve 220 are low power consumption, have a sharp RSSI curve and the linear region must fall in the signal power level lower than the sensitivity level. This can be accomplished by adjusting the second RSSI curve 220 at the very low power end by using output from at least one last-stage amplifier as input to a second RSSI unit used for this purpose and power saving. The RSSI value is basically the multiplication of a full-wave rectifier output current and load resistor, adjusting the current or load resistor can change the shape of RSSI curve. In the regular RSSI curve 210, the curve of the low power region (less than "B") only occupies less than 5% of the curve ("C" to "D"). The second RSSI curve 220 could make the small DC range ("C" to "D") extend to full range ("C" to zero volts) and discard the high power end, forming a much sharper curve. With proper design, the linear region can be farther lower than the sensitivity level.

Figure 3:
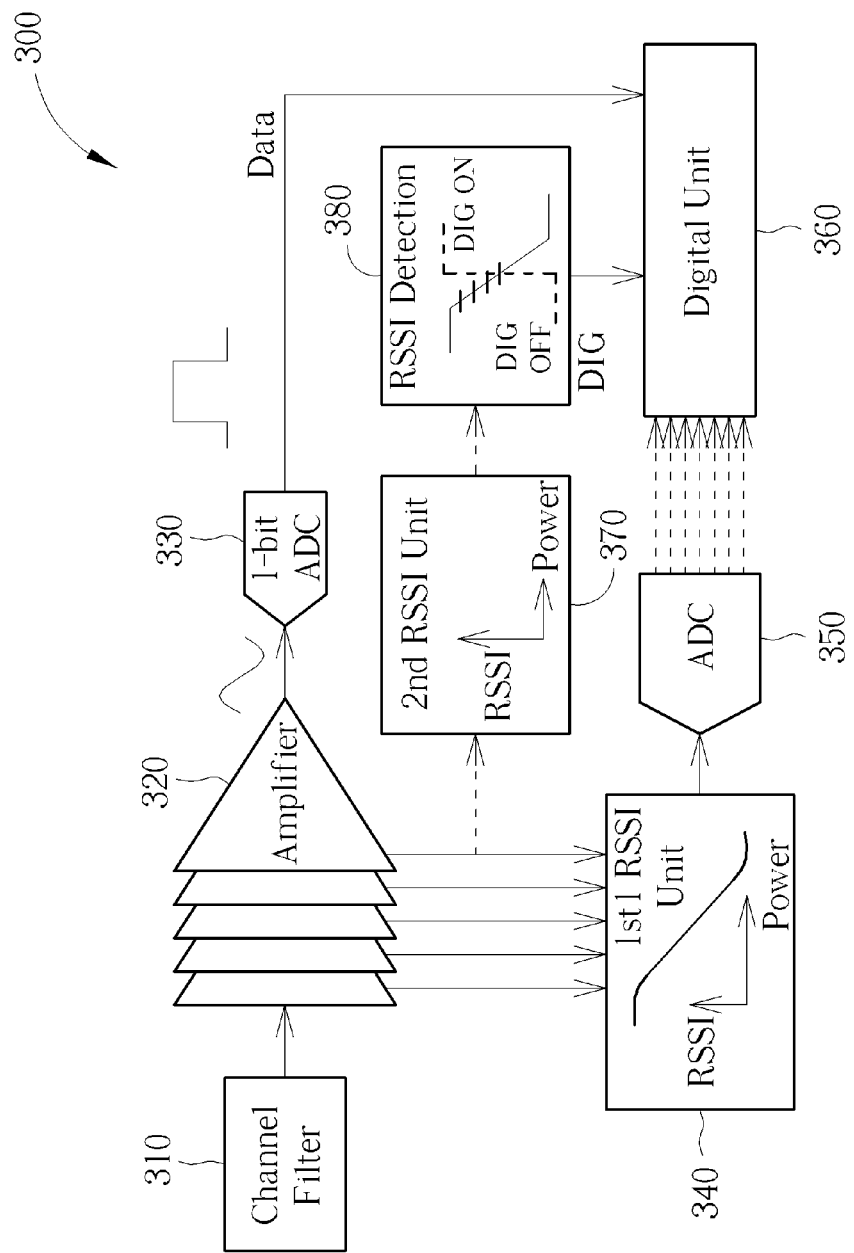
FIG. 3 is a functional block diagram of a digital receiver according to one embodiment.

Please refer to FIG. 3, which is a functional block diagram of a digital receiver 300 according to one embodiment. The digital receiver 300 may comprise a channel filter 310 which outputs a received analog signal to a chain of cascaded amplifiers 320. The analog output of the chain of cascaded amplifiers 320 may be converted into data by a first 1-bit analog-to-digital converter (ADC) and sent to the digital unit 360 for processing. Output of each amplifier stage 320 in the chain is also sent to the first RSSI unit 340 which outputs the corresponding signals to a second ADC 350. The ADC 350 then outputs corresponding signals to the digital unit 360.

One of the differences between the digital receiver 300 and digital receivers in the prior art is that the digital receiver 300 also may include a second RSSI unit 370 coupled to receive output of at least one of the last amplifier stages 320 in the chain of amplifiers 320. Because input to the second RSSI unit 370 is limited to coming from only the at least one of the last amplifier stages 320 in the chain, a different RSSI curve is generated than is generated by the first RSSI unit 340 which receives input from all of the amplifier stages 320. When compared to the first RSSI unit 340, the second RSSI unit 370 generates a sharper RSSI curve with the linear region falling in the signal power level lower than the sensitivity level as desired. An example of one possible sharper RSSI curve 220 is shown in FIG. 2.

Output of the second RSSI unit 370 is sent to the RSSI detection unit 380 where the output is compared to a predetermined threshold lower than the digital receiver's 300 sensitivity level. Only when the threshold is met or exceeded, the RSSI detection unit 380 causes the digital unit 360 to be turned on, otherwise when the threshold is not met or exceeded, the RSSI detection unit 380 causes the digital unit 360 to be turned off.

Figure 1:
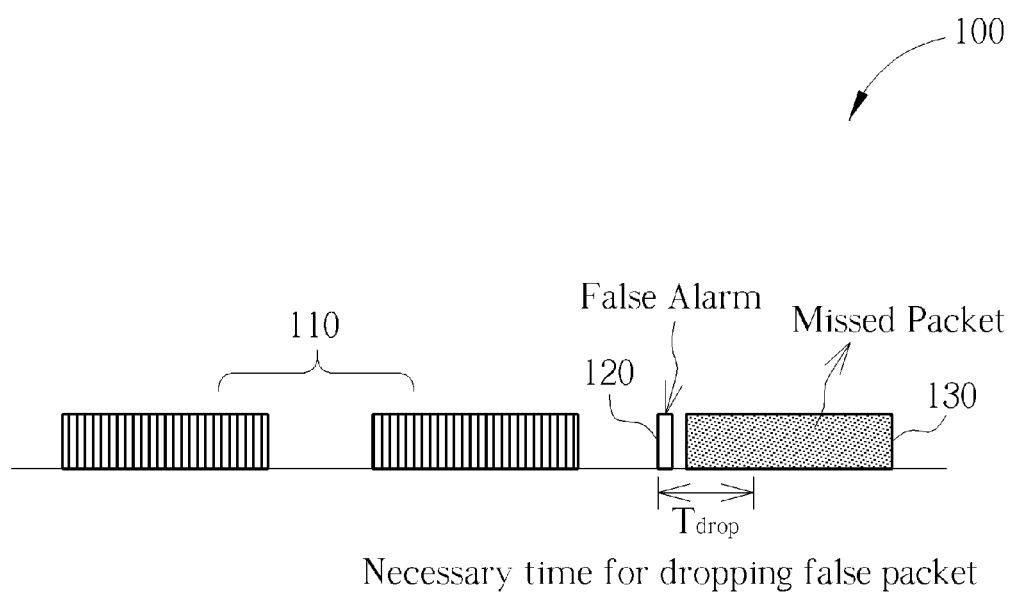
FIG. 1 illustrates a missed packet due to a false alarm.

Because the RSSI curve generated by the second RSSI unit 370 has the linear portion of the RSSI curve lower than the sensitivity level, a suitable threshold indicating whether the received packet is a false alarm can be found experimentally that does not sacrifice the sensitivity of a receiver. Since the digital unit 360 is only turned on when a packet meets or exceeds the predefined threshold, the digital unit 360 does not waste the time $T_{drop}$ recognizing and recovering from false alarms, and missed packets such as packet 130 shown in FIG. 1 are no longer missed and can be processed normally.

These embodiments further are able to reduce power consumption in at least three ways. Firstly, because the digital unit 360 is only turned on when needed, power consumption is reduced by turning the digital unit 360 off when the RSSI detection unit 380 determines the digital unit 360 is not currently needed. Secondly, by limiting input to the second RSSI unit 370 to coming from only at least one of the last amplifiers 320 in the chain, no additional amplifier stages 320 to extend the dynamic range (and additional power consumption) are needed to avoid the false alarms. Thirdly, when the digital unit 360 is turned off, the first RSSI unit 340 can also be turned off because it is also not currently needed.

A high sensitivity, low dynamic range, and low power consumption second RSSI (or activation RSSI) unit 370 is presented. The dynamic range is located in the signal power level lower than the digital receiver's 300 sensitivity level, so that the digital unit 360 can be activated earlier and only when required, and prepare for receiving packet. The value of the output of the second RSSI unit 370 is compared with a predetermined threshold that corresponds to a specific power level. A full range constant voltage reference circuit may provide the predetermined threshold level, in other words, defines the turned on power level of digital units. Once the second RSSI unit 370 output value meets or exceeds the predetermined threshold, the output of the RSSI detection unit 380 pulls high and activates digital unit 360. When output of the RSSI detection unit 380 is low so that the digital unit 360 is deactivated, the regular RSSI unit 340 may also be deactivated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital receiver comprising:
a radio frequency analog front end;
a digital processing unit;
a plurality of cascaded amplifier stages configured to receive output of the radio frequency analog front end;
a first analog to digital converter configured to convert an analog signal output from the plurality of cascaded amplifier stages into a digital signal output to the digital processing unit;
a first received signal strength indicator unit configured to receive outputs of each of the plurality of cascaded amplifier stages and output signal to the digital processing unit;
a second received signal strength indicator unit configured to receive output of at least one amplifier stage in the plurality of cascaded amplifier stages; and
a received signal strength indicator detection unit configured to activate and to deactivate the digital processing unit according to a comparison of output from the second received signal strength indicator unit to a predetermined threshold.

2. The digital receiver of claim 1 wherein the received signal strength indicator detection unit is further configured to activate the digital processing unit when output from the second received signal strength indicator unit is lower than a sensitivity level of the digital receiver.

3. The digital receiver of claim 1 wherein the received signal strength indicator detection unit is further configured to activate the digital processing unit only when the output from the second received signal strength indicator unit meets or exceeds the predetermined threshold.

4. The digital receiver of claim 1 wherein the received signal strength indicator detection unit is further configured to deactivate the digital processing unit when the output from the second received signal strength indicator unit does not meet or exceed the predetermined threshold.

5. The digital receiver of claim 1 further comprising a second analog to digital converter configured to convert analog signal output from the first received signal strength indicator unit into digital signal input into the digital processing unit.

6. The digital receiver of claim 1 wherein a number of the at least one amplifier in the plurality of cascaded amplifiers is smaller than a number of the plurality of amplifiers.

7. The digital receiver of claim 1 wherein the at least one amplifier stage of the plurality of cascaded amplifier stages includes a last amplifier stage in the plurality of cascaded amplifier stages.

8. The digital receiver of claim 1 wherein the first analog to digital converter is a 1-bit analog to digital converter.

9. The digital receiver of claim 1 wherein the digital receiver is configured to deactivate the first received signal strength indicator unit when the digital processing unit is deactivated by the received signal strength indicator detection unit.

10. A digital receiver comprising:
a radio frequency analog front end;
a digital processing unit;
a plurality of cascaded amplifier stages configured to receive output of the radio frequency analog front end;
a 1-bit analog to digital converter configured to convert an analog signal output from the plurality of cascaded amplifier stages into a digital signal output to the digital processing unit;
a first received signal strength indicator unit configured to receive outputs of each of the plurality of cascaded amplifier stages and output signal to the digital processing unit;
a second received signal strength indicator unit configured to receive output of at least one amplifier stage in the plurality of cascaded amplifier stages; and
a received signal strength indicator detection unit configured to activate and deactivate the digital processing unit according to a comparison of output from the second received signal strength indicator unit to a predetermined threshold.

11. The digital receiver of claim 10 wherein the received signal strength indicator detection unit is further configured to activate the digital processing unit when the output from the second received signal strength indicator unit meets or exceeds the predetermined threshold.

12. The digital receiver of claim 10 wherein the received signal strength indicator detection unit is further configured to deactivate the digital processing unit when the output from the second received signal strength indicator unit does not meet or exceed the predetermined threshold.

13. The digital receiver of claim 10 further comprising a second analog to digital converter configured to convert analog signal output from the first received signal strength indicator unit into digital signal input into the digital processing unit.

14. The digital receiver of claim 10 wherein a number of the at least one amplifier in the plurality of cascaded amplifiers is smaller than a number of the plurality of amplifiers.

15. The digital receiver of claim 10 wherein the at least one amplifier of the plurality of cascaded amplifiers includes a last amplifier in the plurality of cascaded amplifiers.

16. The digital receiver of claim 10 wherein the digital receiver is configured to deactivate the first received signal strength indicator unit when the digital processing unit is deactivated by the received signal strength indicator detection unit.

17. A method of operating a digital receiver comprising a radio frequency analog front end, a digital processing unit, a plurality of cascaded amplifiers configured to receive output of the radio frequency analog front end, a first analog to digital converter configured to convert an analog signal output from the plurality of cascaded amplifiers into a digital signal output to the digital processing unit, and a first received signal strength indicator unit configured to receive outputs of each of the plurality of cascaded amplifiers and output signal to the digital processing unit, the method comprising:
receiving output of at least one amplifier in the plurality of cascaded amplifiers to generate a received signal strength indicator signal;
comparing the received signal strength indicator signal to a predetermined threshold to generate a comparison result; and
activating the digital processing unit according to the comparison result.

18. The method of claim 17 further comprising activating the digital processing unit when the received signal strength indicator signal meets or exceeds the predetermined threshold.

19. The method of claim 17 further comprising deactivating the digital processing unit when the received signal strength indicator signal does not meet or exceed the predetermined threshold.

20. The method of claim 17 further comprising deactivating the first received signal strength indicator unit when the digital processing unit is deactivated according to the comparison result.

* * * * *

UNITED STATES PATENT AND TRADEMARK OFFICE
CERTIFICATE OF CORRECTION

| | |
|---|---|
| PATENT NO. | : 8,971,453 B1 |
| APPLICATION NO. | : 14/013043 |
| DATED | : March 3, 2015 |
| INVENTOR(S) | : Yiping Fan et al. |

It is certified that error appears in the above-identified patent and that said Letters Patent is hereby corrected as shown below:

On the title page, item (71), correct the residence of the applicant from "Hsin-Chu, TX (US)" to --Hsin-Chu (TW)--.

Signed and Sealed this
Fourteenth Day of July, 2015

Michelle K. Lee
*Director of the United States Patent and Trademark Office*